United States Patent
Yu et al.

(10) Patent No.: US 7,544,566 B2
(45) Date of Patent: Jun. 9, 2009

(54) METHOD FOR MANUFACTURING A NON-VOLATILE ELECTRICALLY ALTERABLE MEMORY CELL THAT STORES MULTIPLE DATA

(75) Inventors: Andy T. Yu, Palo Alto, CA (US); Ying W. Go, Palo Alto, CA (US)

(73) Assignee: Nanostar Corporation, Palo Alto, CA (US)

( * ) Notice: Subject to any disclaimer, the term of this patent is extended or adjusted under 35 U.S.C. 154(b) by 0 days.

(21) Appl. No.: 11/744,730

(22) Filed: May 4, 2007

(65) Prior Publication Data

US 2007/0200163 A1 Aug. 30, 2007

Related U.S. Application Data

(62) Division of application No. 11/036,911, filed on Jan. 14, 2005.

(51) Int. Cl.
*H01L 21/336* (2006.01)
(52) U.S. Cl. .................................. 438/257; 257/E21.68
(58) Field of Classification Search .................. 438/257
See application file for complete search history.

(56) References Cited

U.S. PATENT DOCUMENTS

| | | | |
|---|---|---|---|
| 4,613,956 A | 9/1986 | Paterson et al. | |
| 4,774,556 A | 9/1988 | Fujii et al. | |
| 4,851,365 A * | 7/1989 | Jeuch | 438/257 |
| 4,959,812 A | 9/1990 | Momodomi et al. | |
| 4,980,861 A | 12/1990 | Herdt et al. | |
| 5,414,693 A | 5/1995 | Ma et al. | |
| 5,949,711 A | 9/1999 | Kazerounian | |
| 6,191,975 B1 | 2/2001 | Shimizu et al. | |
| 6,440,796 B2 | 8/2002 | Sung | |
| 6,459,121 B1 * | 10/2002 | Sakamoto et al. | 257/315 |
| 6,462,375 B1 * | 10/2002 | Wu | 257/316 |
| 6,657,250 B1 | 12/2003 | Rudeck | |
| 6,803,276 B2 | 10/2004 | Kim et al. | |
| 6,838,726 B1 | 1/2005 | Forbes et al. | |

OTHER PUBLICATIONS

A Dual Gate Flash EEPROM Cell With Two-Bits Storage Capacity; M. Lorenzini, M. Rudan et al.; 1996 IEEE; 1996 Int'l. NonVolatile Memory Technology Conferences.
A Dual Gate Flash EEPROM Cell With Two-Bits Storage Capacity; M. Lorenzini, et al.; 1997 IEEE; Transactions on Components, Packaging and Mfg. and Mfg. Technology-Part A, vol. 20, No. 2 Jun. 1997.

* cited by examiner

*Primary Examiner*—Thao P. Le
(74) *Attorney, Agent, or Firm*—Haynes and Boone, LLP (57) ABSTRACT

A self-aligned method for manufacturing an electrically alterable memory device on a semiconductor layer includes (a) forming an insulating layer on the semiconductor layer, (b) depositing a first conductive layer on the insulating layer, (c) forming trench isolation regions along and into the semiconductor layer, (d) depositing a sacrificial material on the first conductive layer, (e) etching the sacrificial material to form isolation channels, (f) forming two gate masks along lateral sides of the sacrificial material, (g) etching the first conductive layer to extend the channels to the insulating layer, (h) etching the sacrificial material to form a control channel, (i) etching the block of the first conductive layer, and (j) filling the control channel with a second conductive layer.

24 Claims, 9 Drawing Sheets

METHOD FOR MANUFACTURING A NON-VOLATILE ELECTRICALLY ALTERABLE MEMORY CELL THAT STORES MULTIPLE DATA

RELATED APPLICATION

The present application is a division of U.S. patent application Ser. No. 11/036,911 filed on Jan. 14, 2005 which is related to the U.S. patent application Ser. No. 10/801,789, Non-Volatile Electrically Alterable Memory Cell for Storing Multiple Data and an Array Thereof, filed on Mar. 16, 2004, both of which are incorporated herein in its entirety by this reference.

BACKGROUND OF THE INVENTION

1. Field of the Invention

The present invention relates to logic gate structures, and particularly, to an electrically erasable and programmable read-only memory (EEPROM) and to Flash EEPROMs employing floating gate structures, and more specifically, to a self-aligned manufacturing process thereof.

2. Description of the Related Art

Electrically erasable and programmable non-volatile semiconductor devices, such Flash EEPROMs are well known in the art. One type of Flash EEPROM employs metal-oxide-semiconductor (MOS) floating gate devices. Typically, electrical charge is transferred into an electrically isolated (floating) gate to represent one binary state while an uncharged gate represents the other binary state. The floating gate is generally placed above and between two regions (source and drain) spaced-apart from each other and separated from those regions by a thin insulating layer, such as a thin oxide layer. An overlying (control) gate is disposed above the floating gate provides capacitive coupling to the floating gate, allowing an electric field to be established across the thin insulating layer. "Carriers" from a channel region under the floating gate are tunneled through the thin insulating layer into the floating gate to charge the floating gate. The presence of the charge in the floating gate indicates the logic state of the floating gate, i.e., 0 or 1.

Several methods can be employed to erase the charge in a floating gate. One method applies ground potential to two regions and a high positive voltage to the overlying gate. The high positive voltage induces charge carriers, through the Fowler-Nordheim tunneling mechanism, on the floating gate to tunnel through an insulating layer that separates the overlying gate and the floating gate into the overlying gate. Another method applies a positive high voltage to a source region and grounds the overlying gate. The electric field across the layer that separates the source region and the floating gate is sufficient to cause the tunneling of electrons from the floating gate into the source region.

Typically, the induction and elimination of electrical charges from the floating gate depends on the voltage applied to the control gate and induced into the floating gate. The coupling ratio between a control gate and a floating gate is important because it determines the voltage induced to the floating gate. The coupling ration depends on the exposure between these two gates. Memory cells with long tall gates facing each other are desired because of good coupling ratio; however, they are difficult to manufacture. Therefore, it is to this manufacturing process the present invention is primarily directed to.

SUMMARY OF THE INVENTION

In one aspect, the invention is a non-volatile memory that includes a first trench isolation region, a second trench isolation region apart from the first trench isolation region, a control gate having a first width, a first floating gate having a second width, and a second floating gate having a third width, wherein the control gate being placed between the first and second floating gates and the first width of the control gate and the second and third widths of the first and second floating gates being defined by the first and second trench isolation regions.

In another aspect, the invention is a self-aligning method for defining the width of an active region of a non-volatile memory device using a mask, wherein the active region includes a control gate and two floating gates. The method includes the steps of forming a first and a second field isolation regions using the mask, and forming an active region of a non-volatile memory device between the first and second field isolation regions, the active region having a width defined by the first and second field isolation regions, wherein the width of the active region further defines a width of the control gate and each of the two floating gates.

In yet another aspect, the invention is a self-aligned method for defining a channel length of a floating gate in a semiconductor structure, wherein the semiconductor structure includes a polysilicon layer, a plurality of blocks of a sacrificial material on the top of the polysilicon layer, and a layer of oxide material covering the semiconductor structure. The method includes the steps of etching the oxide material to form a gate mask that has a length and etching the sacrificial material and the polysilicon layer to form a floating gate under the gate mask, wherein the floating gate having a channel length defined by the length of the gate mask.

In yet another aspect, the invention is a self-aligned method for manufacturing an electrically alterable memory device on a semiconductor material composed of a structure of a first semiconductor layer doped with a first dopant in a first concentration and a second semiconductor layer on the top of the first semiconductor layer doped with a second dopant in a second concentration, the second dopant having an opposite electrical characteristic than the first dopant, the second semiconductor layer having a top side. The method includes the steps of growing a layer of tunnel oxide or an insulating material on the top side of the second semiconductor layer, depositing a layer of a conductive material, such as a first polysilicon layer, on the tunnel oxide layer, forming a plurality of shallow trench regions along a first direction, depositing a layer of a sacrificial material, such as a silicon nitride layer, on the top of the first polysilicon layer, and etching the silicon nitride layer to form a plurality of isolation channels along a second direction that is substantially perpendicular to the first direction. Two adjacent isolation channels delimits one block of silicon nitride and each block of silicon nitride has two lateral sides, a top, and a bottom, and extends substantially from the top of the silicon nitride to the top of the first polysilicon layer. The method further includes the steps of forming two gate masks along two lateral sides of each block of silicon nitride, etching the first polysilicon at the bottom of each isolation channel to extend the isolation channel to the tunnel oxide. Two adjacent isolation channels delimit one block of first polysilicon located under one block of silicon nitride. The method is followed by filling the isolation channels up to the top of the silicon nitride layer with an oxide, etching each block of silicon nitride to form a plurality of control channels, etching the center of each block of first polysilicon to extend the bottom of each control channel to the tunnel oxide, and filling each control channel with a second conductive material, such as a second polysilicon. The step etching the center of each block of the first polysilicon leaves two lateral blocks of first polysilicon under two gate masks, and two lateral blocks of the first polysilicon serves as floating gates while the second polysilicon serves as control gate.

In yet another aspect the invention is an electrically alterable memory device. The memory device includes a first semiconductor layer doped with a first dopant in a first concentration, a second semiconductor layer on top of the first semiconductor layer, doped with a second dopant that has an opposite electrical characteristic than the first dopant, the second semiconductor layer having a top side, and two spaced-apart diffusion regions embedded in the top side of the second semiconductor layer. Each diffusion region is doped with the first dopant in a second concentration greater than the first concentration, and the two diffusion regions including a first diffusion region and a second diffusion region, wherein a first channel region defined between the first diffusion region and the second diffusion region. The memory device further includes a first floating gate having a first side, a second side, and a first height and is comprised of a conductive material, and a second floating gate having a first side, a second side, and a second height and is comprised of a conductive material. The first floating gate is disposed adjacent the first diffusion region and above the first channel region and separated therefrom by a first insulator region, the first floating gate capable of storing electrical charge. The second floating gate is disposed adjacent the second diffusion region and above the first channel region and separated therefrom by a second insulator region, the second floating gate capable of storing electrical charge. A first control gate and second control gate are disposed between the first floating gate and second floating gate. The first control gate has a third height and is comprised of a conductive material. The first control gate is disposed laterally adjacent the first floating gate and separated therefrom by a first vertical insulator layer and above the first channel region and separated therefrom by a third insulator region. The second control gate has a fourth height and is comprised of a conductive material. The second control gate is disposed laterally adjacent the second floating gate and the first control gate and separated from the second floating gate by a second vertical insulator layer and separated from the first control gate by an oxide layer deposited between two control gates. The second control gate is placed above the first channel region and separated therefrom by the third insulator region.

The present invention is therefore advantageous because it enables manufacturing of multi-data memory cells. Other advantages and features of the present invention will become apparent after review of the hereinafter set forth Brief Description of the Drawings, Detailed Description of the Invention, and the Claims.

DETAILED DESCRIPTION OF THE INVENTION

Figure 1:
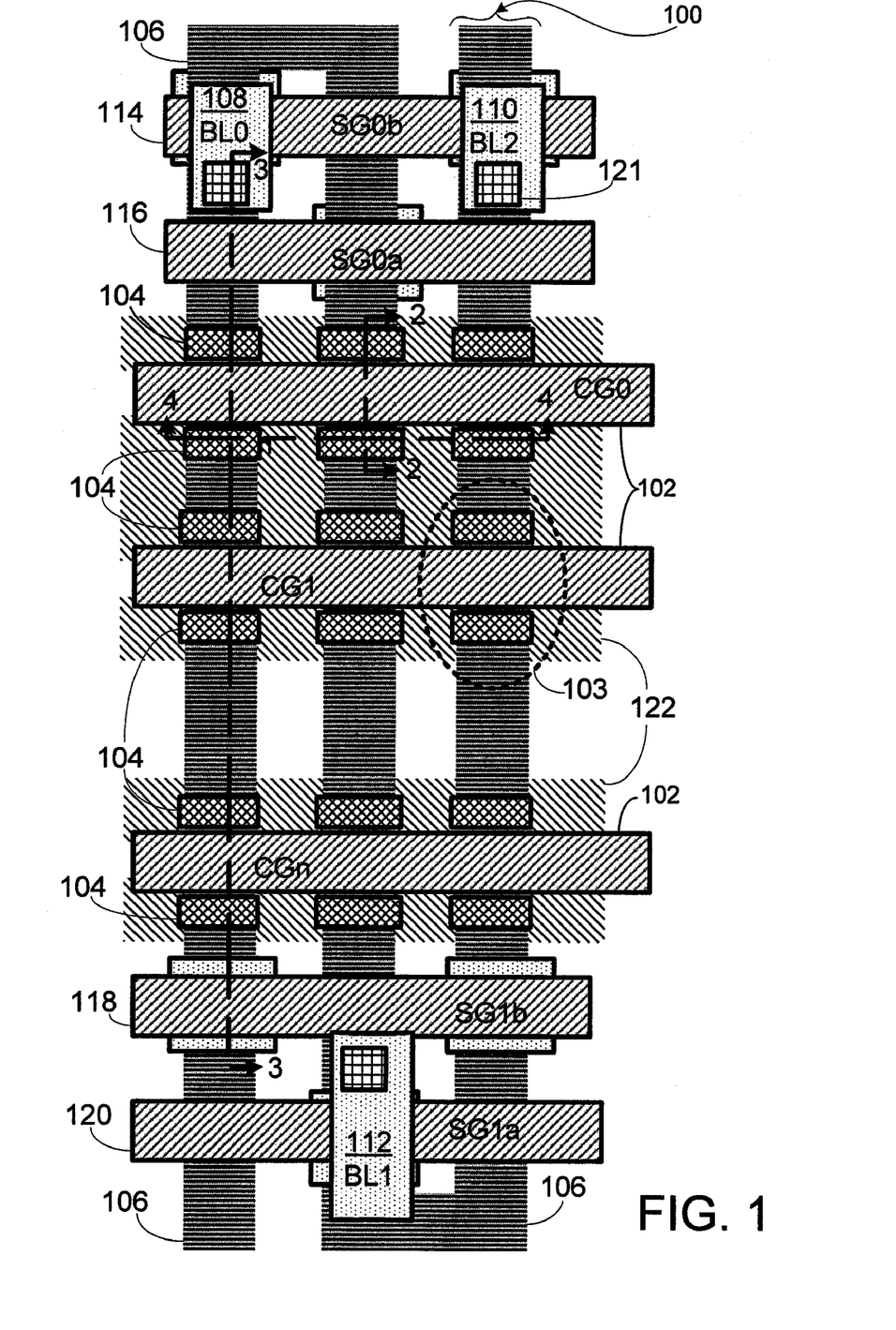
FIG. 1 is a top plan view of a plurality of memory strings according to one embodiment of the invention.

Three electrically programmable and erasable non-volatile memory strings are shown in FIG. 1. Each memory string 100 includes an active region 106 running vertically and a plurality of control gates 102 running horizontally across multiple memory strings. The active region other than gate areas is heavily doped with a first dopant. The control gate is formed by polysilicon or other suitable material. A plurality of floating gates 104 are disposed adjacent to the control gate 102 and over the active region 106. Each control gate 102 is surrounded by two floating gates 104 on two sides.

The combination of two floating gates 104 surrounding one control gate 102 over one area of the active region 106 forms a memory cell 103. Each memory cell 103 stores two data, one on each floating gate 104. Each memory string 100 may have many memory cells 103. The memory cells 103 on a memory string 100 are delimited by a first select gate 116 and a second select gate 120. The first select gate 116 and the second select gate 120 run horizontally over all memory strings 100 and over the active region 106. The area of the active region 106 not covered by the floating gates 104, the control gates 102, and the select gates 114, 116, 118, 120 are doped diffusion regions. A vertical connector 121 connects the active region 106 to a bit line 110 that runs vertically through multiple memory strings 100.

Each memory string 100 is connected to an adjacent memory string 100 through the active region 106. The separation of memory cells 103 in one memory string 100 from memory cells 103 of an adjacent memory string 100 may be accomplished through an isolation layer 122, such as localized oxidation (LOCOS), recessed LOCOS, mini-LOCOS isolation, field implant isolation, thick field oxide isolation, shallow trench isolation (STI), deep trench isolation, full oxide isolation, and other suitable available methods. The isolation layers 122 used to separate active regions 106 may be interconnected instead of discrete elements. In some embodiments (not shown), the isolation layers 122 can surround an entire active region. A plurality of memory strings 100 may form a high density memory array. Each of memory strings 100 may be formed through the manufacturing process of the present invention, which is described herein.

Figure 2:
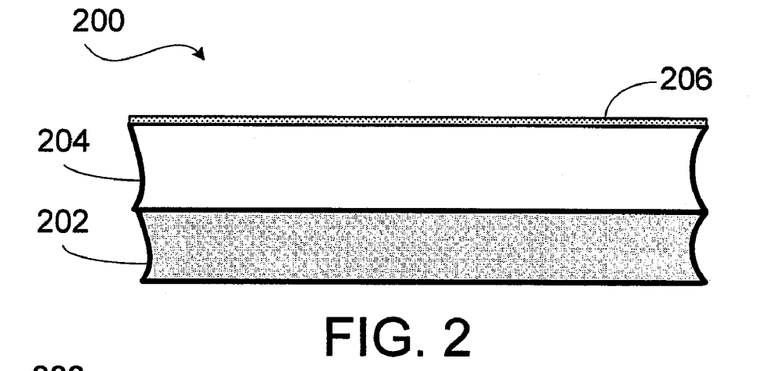
FIGS. 2-15 illustrate structures of a memory cell during different manufacturing stages.

Typically, a memory cell manufacturing starts from a silicon wafer, a cross section of which is shown in FIG. 2. The cross section 200 shows a semiconductor substrate 202 and a well 204 on the top of the substrate 202. The substrate is doped with a first dopant, which can be either N type or P type. The well 204 is formed by doping the substrate with a second dopant with an electrical characteristic that is opposite of the first dopant. After the substrate 202 and well 204 are formed, a layer of tunnel oxide 206 is grown on the top of the well 204.

Figure 3:
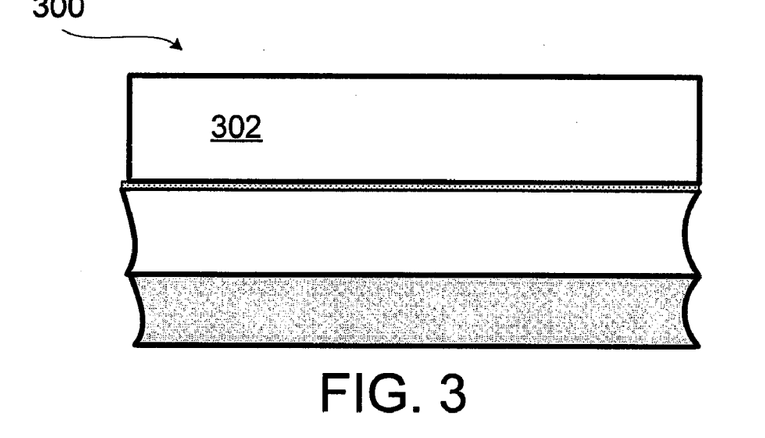
Figure 4:
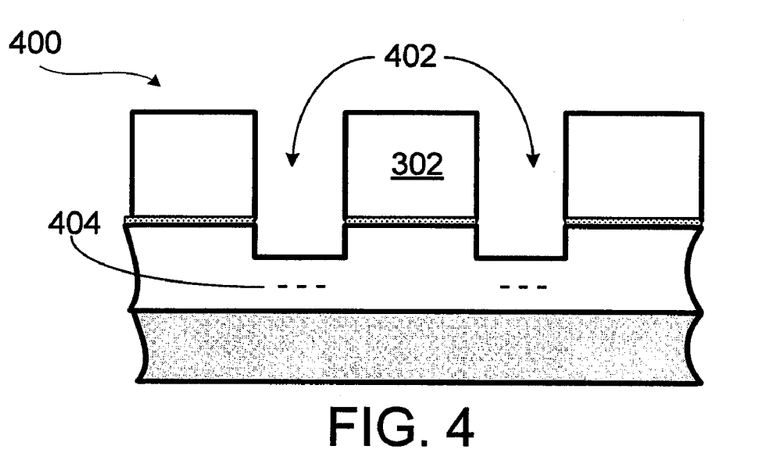

After the tunnel oxide 206 is grown, a layer of first polysilicon 302 is deposited on the top of the tunnel oxide 206 as shown in FIG. 3. The first polysilicon 302 is later used for forming floating gates. FIG. 4 illustrates formation of shallow trench isolation (STI) regions 402 that are used to isolate memory cells of adjacent memory strings 100. The STI regions 402 are formed by etching out on a first direction a region the first polysilicon 302, the tunnel oxide 206, and partially into the well 204. The resulting STI region 402 extends from the top of the first polysilicon 302 into the well 204. The STI regions 402, also known as field isolation regions, may be interconnected at their ends. In some situations, the STI regions 402 may be interconnected at both of their ends and completely surround transistor elements implemented at the later stages. After etching the STI regions 402, a liner oxidation is grown over the surface of the STI regions 402 so the silicon surface is protected from the next step of field implant. The field implant provides additional doping to the bottom of the STI regions 402 and serves to isolate adjacent memory cells. The etching of the STI regions and field implant could be done through any of processes known to those skilled in the art. Although, STI is illustrated in FIG. 4 and used in the description, it is understood that other isolation techniques, such as deep trench isolation, can also be used. Deep trench isolation would be formed by etching into the substrate 202.

Figure 5:
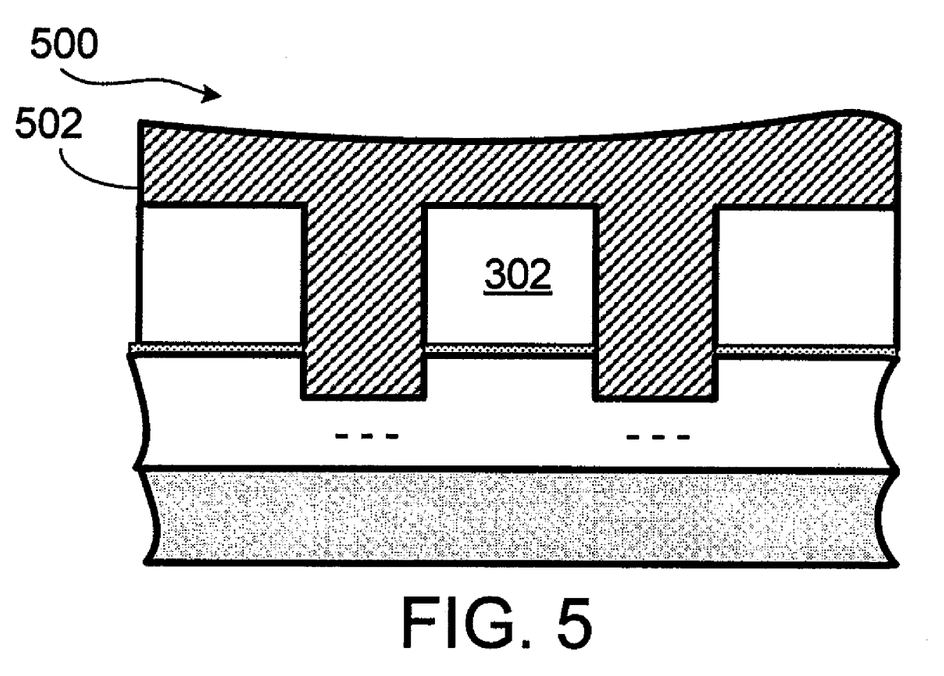
Figure 6:
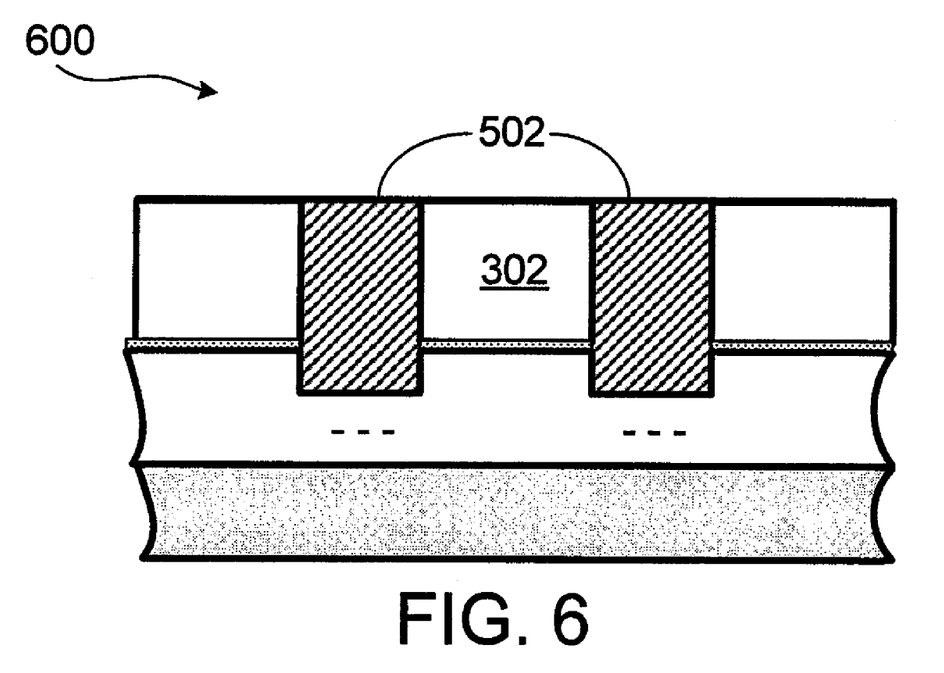

After the liner oxidation, the STI regions 402 are filled with oxide 502, as shown in FIG. 5, through high density plasma (HDP) oxide deposition. The oxide 502 may also be deposited through either a chemical vapor deposition (CVD) or Silicon Glass (SG) deposition. Materials other than Silicon Glass may also be used for the deposition. The oxide deposition process is followed by an anneal process, in which the temperature is raised to relieve stress in the structure resulting from the deposition process. The excess of oxide 502 are removed through either a chemical mechanical polishing (CMP) process or planarization etching process, and the resulting structure is shown in FIG. 6.

Though etching of the STI regions 402 and subsequent filling with oxide 502 has been described above, it is appreciated by those skilled in the art that other methods, such as those listed in paragraph [0020], may be used.

Figure 7:
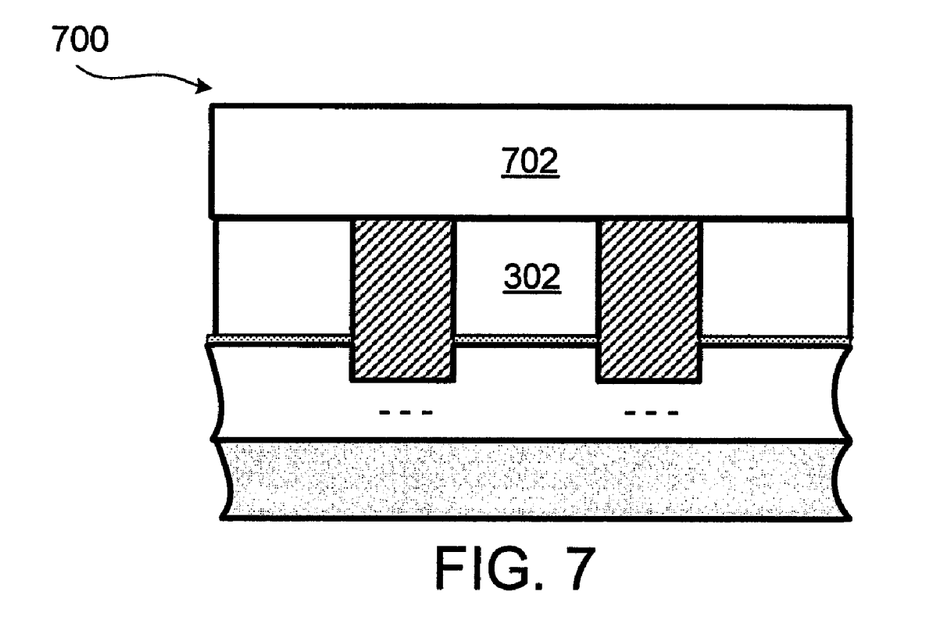
Figure 8:
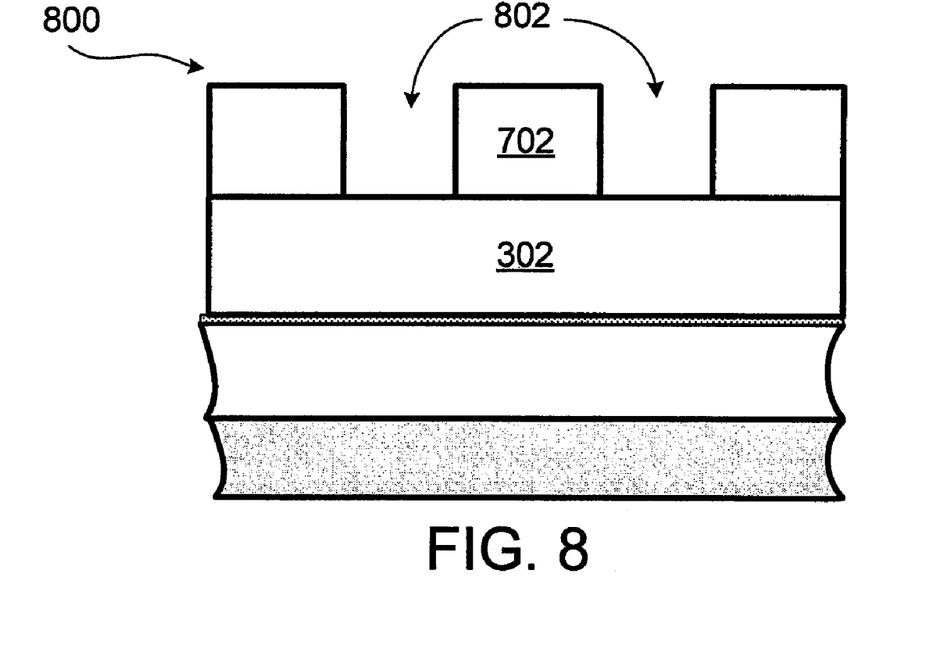
Figure 9:
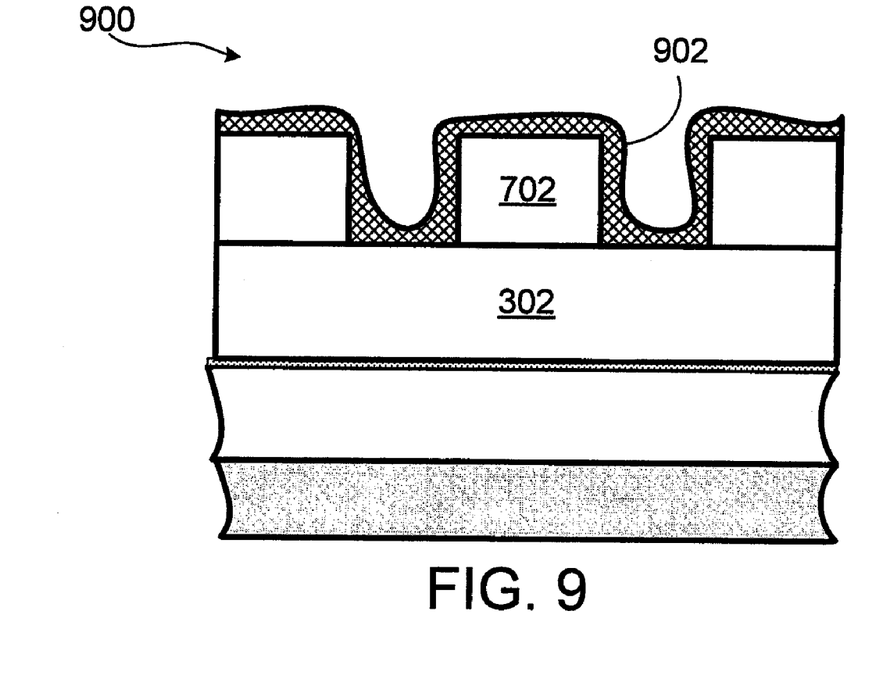
Figure 10:
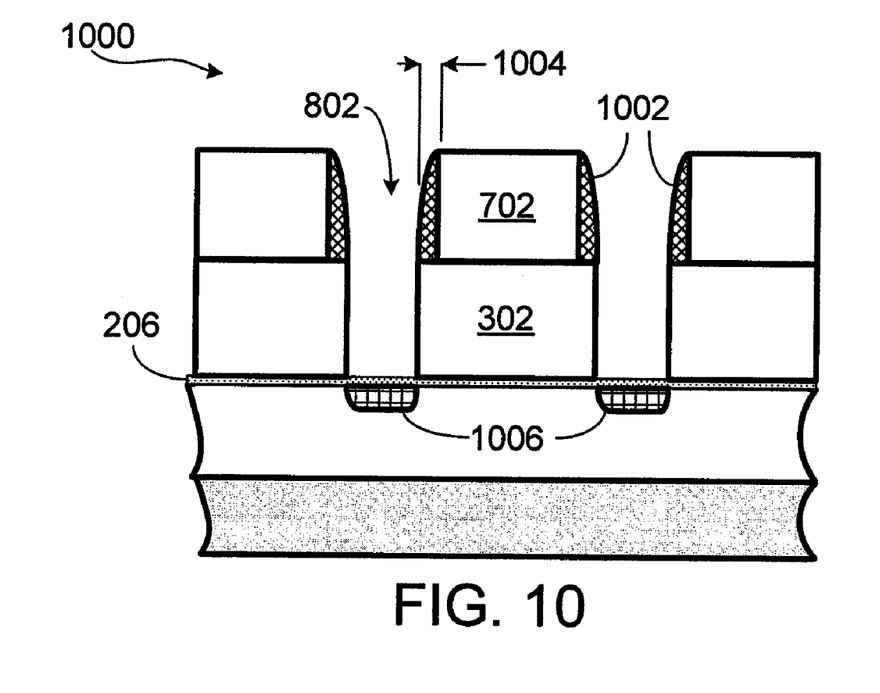

FIG. 7 shows a layer of silicon nitride (SiN) 702 being deposited on top of the polished surface. The silicon nitride is a sacrificial material that is deposited and etched to provide insulation. The SiN layer 702 covers the oxide 502 in the STI regions 402 and the first polysilicon layer 302. After the SiN layer 702 is deposited, the next step is to etch the SiN layer 702 along a second direction that is perpendicular to the first direction of the STI regions 402. The etching of the SiN layers 702 forms a plurality of isolation channels 802. Each isolation channel 802 extends from the top of the SiN layer 702 to the top of the first polysilicon 302. The etched SiN layer 702 is shown in FIG. 8. On the top of the SiN layer 702 is deposited a layer of spacer oxide 902 as shown in FIG. 9. Another anisotropic etching operation removes the excess of the spacer oxide leaving a layer attached to the lateral side of the SiN 702, extending from the top of the SiN 702 to the top of the first polysilicon 302, forming gate masks (oxide edges) 1002 as shown in FIG. 10. The gate masks 1002 have a length 1004 and serve as self-aligned guides for the next step, polysilicon etching. The first polysilicon 302 is etched along the second direction as the SiN 702 layer extending the isolation channels 802 from the top of the SiN 702 to the tunnel oxide layer 206 as shown in FIG. 10. At the bottom of the isolation channels 802, source and drain implants 1006 are formed. The source and drain implants 1006 are done by doping and leaving the bottom of the isolation channels 802 with an appropriate dopant, which is different from the second dopant used for doping the well.

Figure 11:
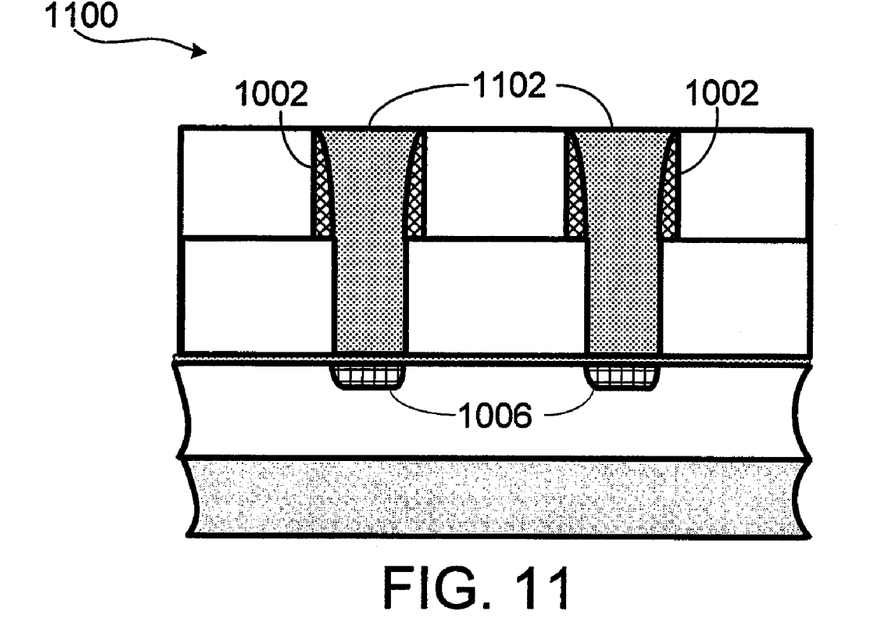

After the source and drain implants are done, another layer of liner oxide is grown over the entire structure including the top of the SiN 702 and the lateral surface of the first polysilicon 302. The isolation channels 802 are then filled up with an oxide 1102 through the HDP process. The oxide 1102 provides reinforcement to the first polysilicon 302 that will be used as floating gates. After the HDP process, another CMP process is performed to produce a plain surface as shown in FIG. 11. The removal of the first polysilicon from the isolation channels 802 and subsequent filling out the isolation channels 802 with oxide is known as Damascene process.

Figure 12:
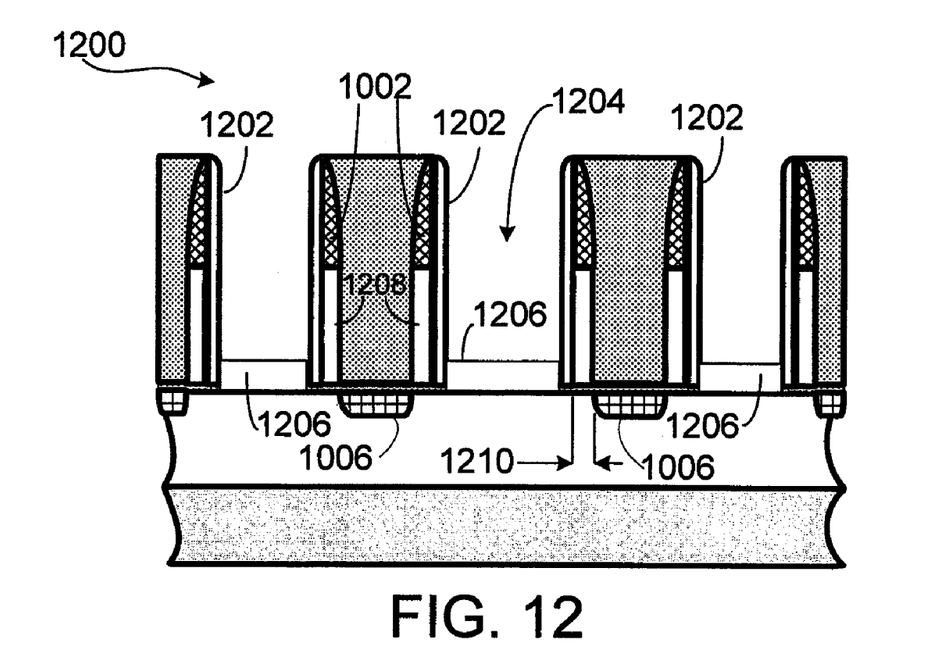

The remaining SiN 702 between oxide edges (gate masks) 1002 is now removed through an etching process to expose the first polysilicon 302. The exposed first polysilicon 302 is removed by anisotropic etching, which removes only material in downward direction along the oxide edges 1002. This removal of the first polysilicon 302 leaves a thin block 1208 of the first polysilicon 302 under each gate mask 1002, as shown in FIG. 12, which will be used as floating gates of the resulting memory cell. The length 1210 of the channel of the resulting floating gates are defined by the length 1004 of the gate mask 1002. The removal of the first polysilicon 302 is a delicate operation and generally tends to weaken the resulting block 1208 of the first polysilicon 302, and sometimes even causes crumbling of the first polysilicon 302. However, because of the previous step for the Damascene process shown in FIGS. 10 and 11, the resulting block 1208 of the first polysilicon 302 is reinforced. The result of etching out the SiN 702 and the first polysilicon underneath is a plurality of control channels 1204 shown in FIG. 12.

A layer of oxide-nitride-oxide (ONO) is deposited on the entire structure, and then removed with anisotropic etching, leaving only a vertical layer of ONO 1202 attached to the side wall of the oxide edges 1002 as shown in FIG. 12. The tunnel oxide 206 at the bottom of the channel 1204 is also removed exposing the well layer 204. After etching the ONO, a high voltage threshold voltage (HV Vt) implant is formed. Dopants are implanted to the well layer 204 at the bottom of the channels 1204. The concentration of dopants modifies the threshold voltage of the resulting memory cell. After HV Vt implant, a gate oxides 1206 is grown at the bottom of the channels 1204.

Figure 13:
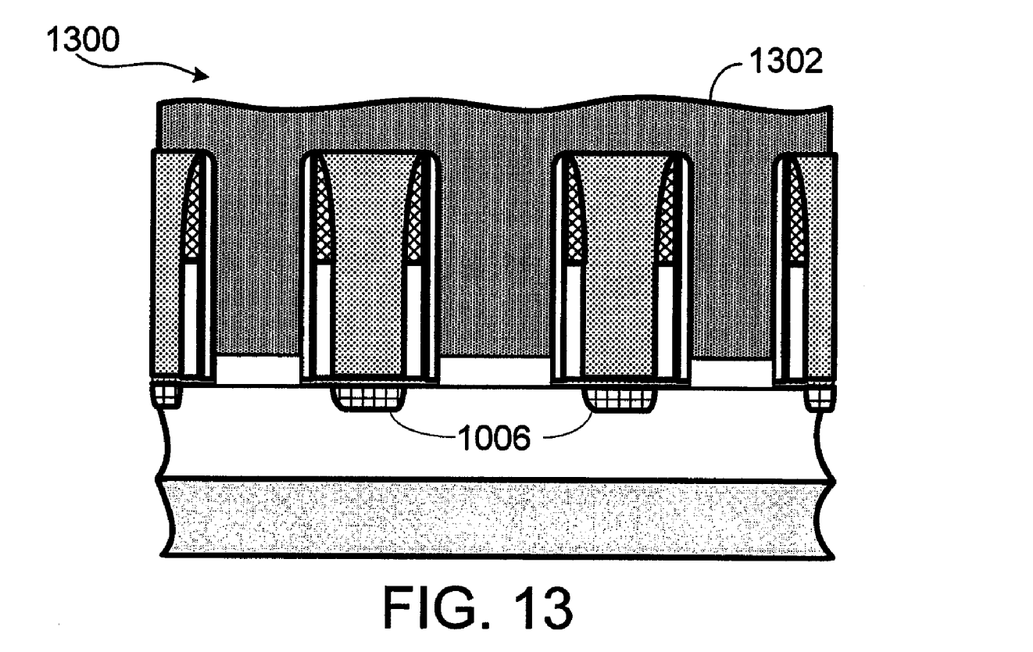

FIG. 13 illustrates the channels 1204 filled with deposition of a second polysilicon layer 1302. The second polysilicon 1302 is doped with dopants to increase its conductivity so later it can be used as control gates for the resulting memory cells. After doping, the second polysilicon 1302 is polished by the CMP process or planarization etching and the resulting structure is shown in FIG. 14.

Figure 14:
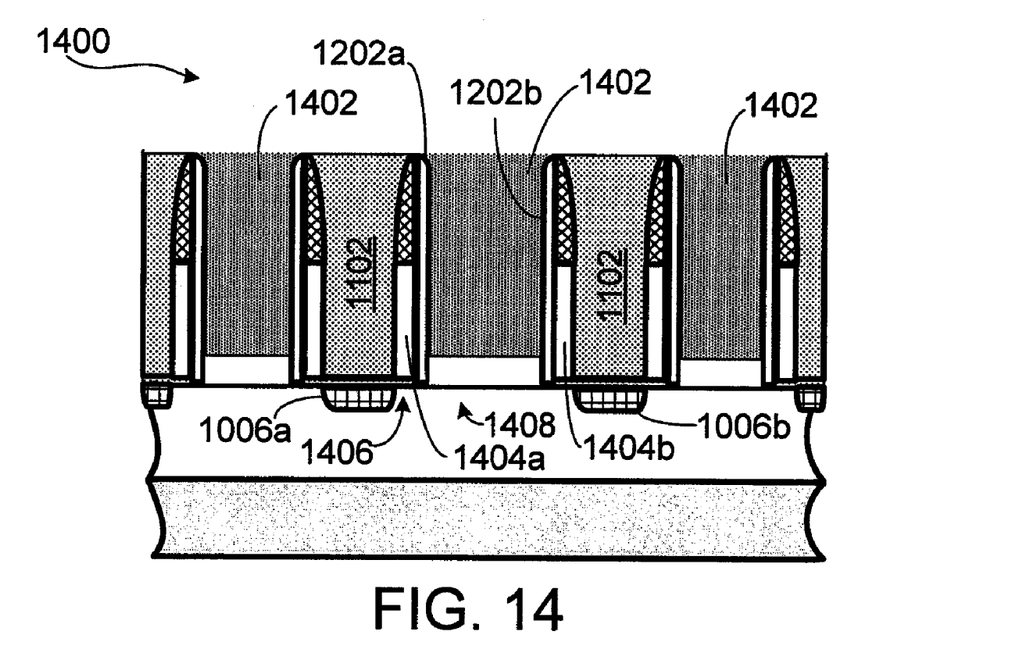

FIG. 14 illustrates three memory cells (not to scale), each memory cell composed of one control gate 1402 and two floating gates 1404a, 1404b. A first floating gate 1401a of polysilicon material is placed above a channel region 1406 and adjacent diffusion region 1006a. The first floating gate 1404a may overlap slightly with the diffusion region 1006a; however, excessive overlapping may reduce the length of the channel region 1406. The first floating gate 1404a is separated from the channel region 1406 by a tunnel oxide 206. The thickness of the tunnel oxide 206 should be thin enough to allow removal of electrons from the first floating gate 1404a under the Fowler-Nordheim tunneling mechanism, but thick enough to prevent the occurrence of a leakage current between the first floating gate 1404a and the well 204. In one embodiment the thickness of the tunnel oxide 206 is between 60 Angstroms and 110 Angstroms. The length of the tunnel oxide 206 under the first floating gate 1404a can be smaller than one lambda, where the lambda is defined by the technology used. For example, if the technology uses 0.18 µm, then one lambda is defined as 0.18 µm. A second floating gate 1404b of polysilicon material is similarly placed.

Figure 15:
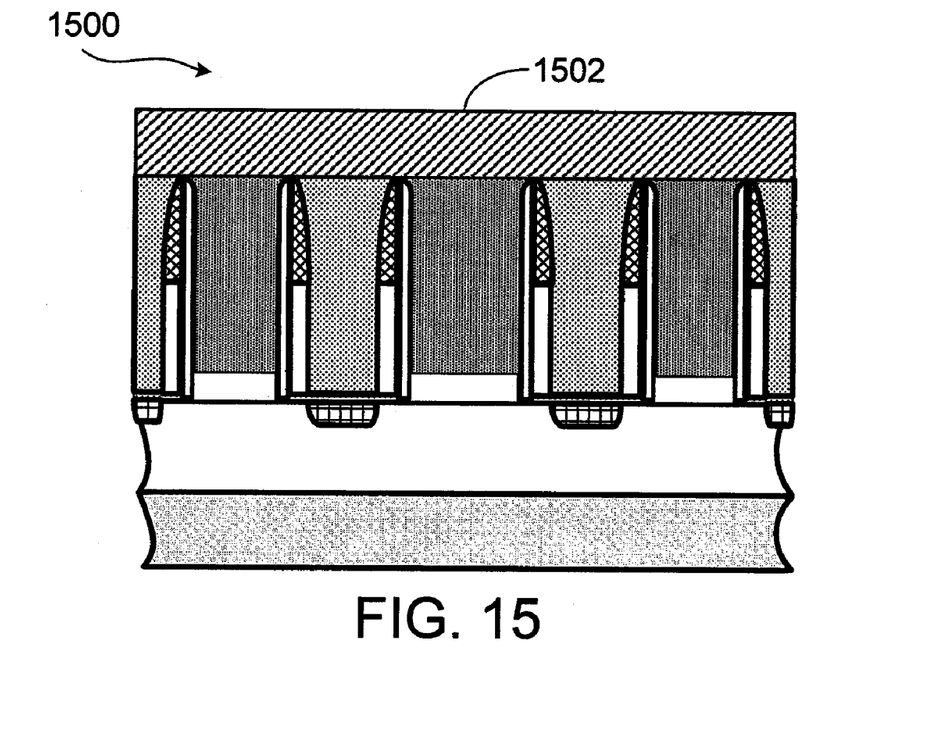

A control gate 1402 is placed above a channel region 1408, laterally between the first floating gate 1404a and the second floating gate 1404b. The control gate 1402 is separated from the first floating gate 1404a by a first vertical insulating layer 1202a and from the second floating gate 104b by a second vertical insulating layer 1202b. The control gate 1402 is separated from the channel region 1408 by the gate oxide 1206. The thickness of the gate oxide 1206 should be thick enough to sustain the stress from the control gate's 1402 voltage variation. The voltage at the control gate 1402 may vary during operation of the memory cell and cause stress on the gate oxide 1206, thus leading to the deterioration of the gate oxide 1206. The control gate 1402 is connected to control gates in other memory cells in different memory strings. The entire structure is finally covered by a layer of oxide 1502 as shown in FIG. 15.

In an alternative embodiment, in the process described above, the oxide 502 and the silicon nitride 702 are interchangeable and the resulting memory cells would also be operational as described above. In yet another alternative embodiment, the process described above is equally applicable for manufacturing of N-channel devices instead of P-channel devices as described above.

The first floating gate 1404a has a first height measured from its bottom edge to its top edge and the second floating gate 1404b has second height also measured from its bottom edge to its top edge. The control gate 1402 has a third height measured from its bottom edge to its top edge. The first height, the second height, and the third height may be identical or may be different. The first height and the second height may be taller or shorter than the third height. The floating gates preferably have height that is larger than their width. Being a shape that is tall provides more area exposed to the control gate and thus allowing more voltage from the control gate be induced to the floating gates. Though a floating gate has a slender profile, its structure is reinforced by the oxide deposition 1102.

Figure 16:
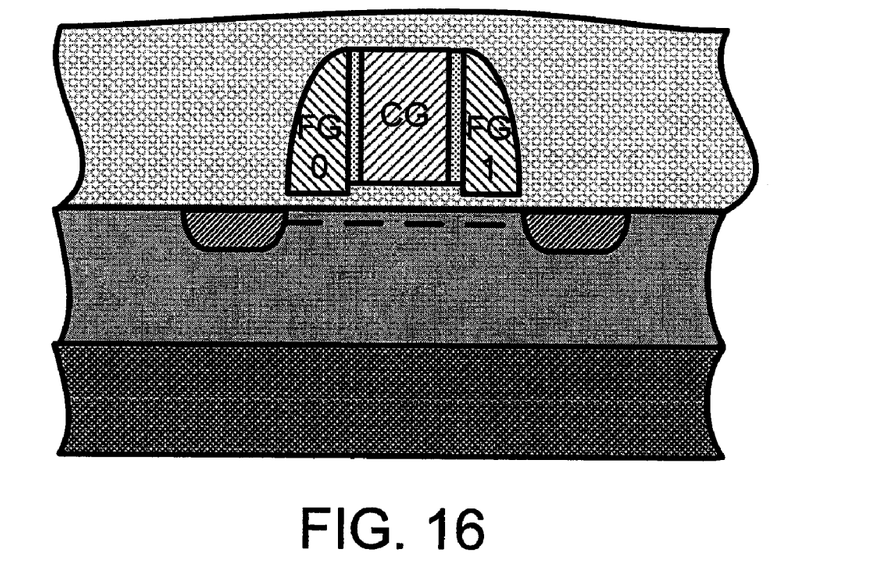
FIG. 16 illustrates an alternate embodiment of the invention.

The coupling effect depends on the thickness of the layers 1202a, 1202b separating the control gate 1402 from the floating gates 1404a, 1404b and the area on each floating gate 1404a, 1404b exposed to the coupling effect. The coupling effect can be easily increased by increasing the area of the floating gates 1404a and 1404b exposed to the control gate 1402, and the area of the floating gates 1404a and 1404b exposed to the control gate 1402 may be increased by increasing the height of the control gate 1402 and the height of the floating gates 1404a and 1404b. A capacitor is formed between the control gate 1402 and each floating gate 1404a, 1404b. If the layer 1202a, 1202b separating the control gate 1402 and the floating gate 1404a, 1404b is too thin, a leakage current may occur between the floating gate 1404a, 1404b and the control gate 1402 when the floating gate 1404a, 1404b is charged with electrons. If the layer 1202a, 1202b is too thick, the coupling ratio may be low, resulting in a low voltage in the floating gate. One workable coupling ratio is between 50%-80%, i.e., 10 V applied to the control gate 1402 results in 5 V to 8 V induced in the floating gate 1404a, 1404b. The combination of the control gate 1402, the floating gates 1404a, 1404b, and the diffusion regions 1006a, 1006b forms a control transistor. The control transistor is capable of holding two data independently, one in each floating gate 1404a, 1404b. Each floating gate 1404a, 1404b may be independently programmed and capable of store multi-bits of data as described in the related U.S. patent application Ser. No. 10/81,789. FIG. 16 is another representation of the control transistor described above.

Figure 17:
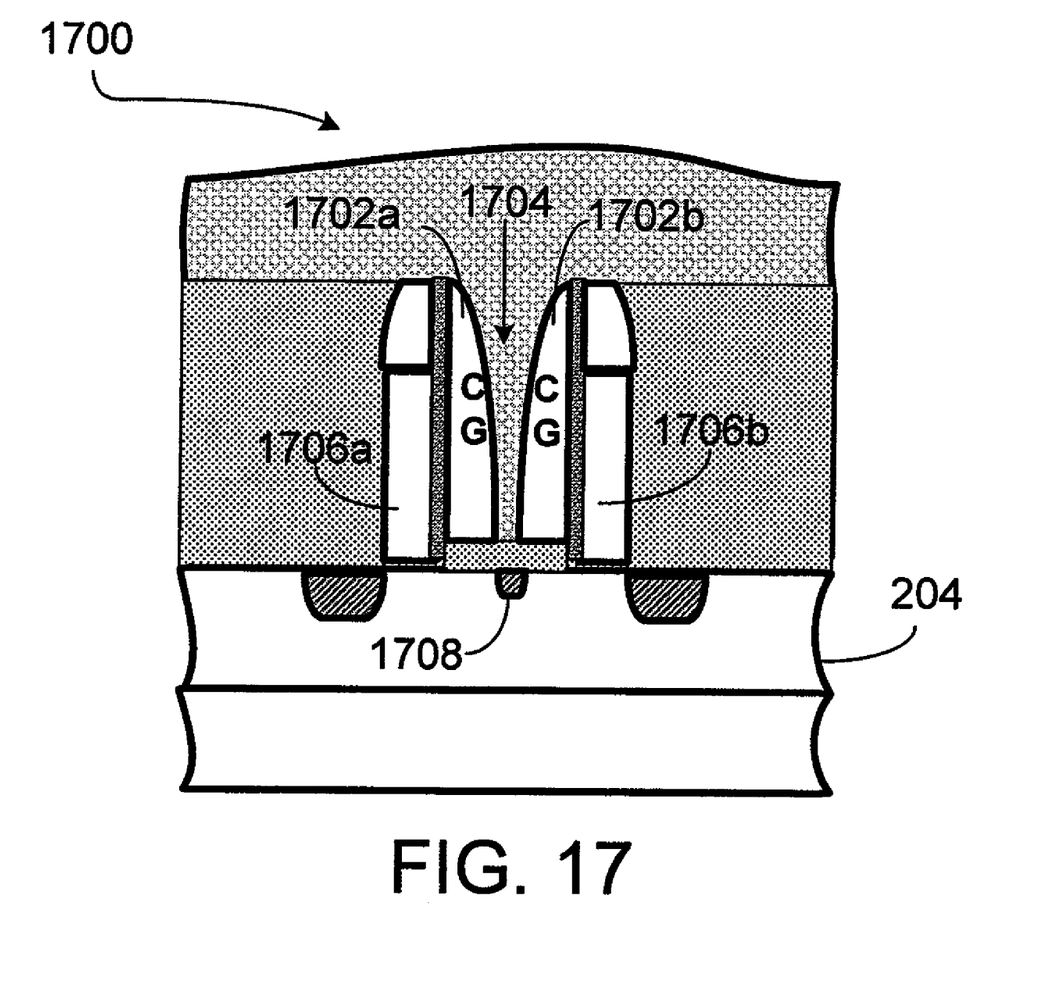
FIG. 17 illustrates yet another alternate embodiment of the invention.

FIG. 17 is another embodiment 1700 of the present invention. In this embodiment 1700, the previously single piece control gate 1402 formed by the second polysilicon is etched through the anisotropic process. Two blocks of the control gates 1702a and 1702b are formed with one channel 1704 separating them. The channel 1704 is later filled with a dielectric oxide. Two capacitors are formed in FIG. 17. One capacitor is formed by the control gate 1702a, the floating gate 1706a and the isolation layer that separates them. Another capacitor is formed by the control gate 1702b, the floating gate 1706b and the isolation layer that separates them. Each capacitor forms a memory cell. The control gate 1702a faces the floating gate 1706a, and the control gate 1702b faces the floating gate 1706b. An additional diffusion region is placed in the well 204 and between the two control gate 1702a and 1702b.

In another embodiment, the floating gates have L-shape profile. One side of the floating gate faces a control gate 1702 and other side faces a layer of shielding oxide. The shielding oxide is a dielectric material and has low (k) capacitance dielectric value. The shielding oxide layer serves as a shield that reduces infringing effect from adjacent memory cells. The "leg" portion of the L-shape floating gate provides an adequate gate over the tunnel oxide. Other shapes of the floating, such as triangle, may also be used to achieve the effect of reducing influence of adjacent memory cells. In a memory cell with triangle-shaped floating gates, an oxide layer of opposite triangle shape can be placed adjacent to the floating gates and to provide the isolating effect.

The memory cells described herein can be easily programmed with the operating voltages described in the related U.S. patent application Ser. No. 10/801,789. Although, the present application is described for Flash EEPROMs, it is understood that the invention is equally applicable for one-time-programmable (OTP) memories, multiple-time-programmable (MTP) memories, and other non-volatile memories.

While the invention has been particularly shown and described with reference to a preferred embodiment thereof, it will be understood by those skilled in the art that various changes in form and detail may be made without departing from the spirit and scope of the present invention as set forth in the following claims. Furthermore, although elements of the invention may be described or claimed in the singular, the plural is contemplated unless limitation to the singular is explicitly stated.

What is claimed is:

1. A self-aligned method for manufacturing an electrically alterable memory device on a semiconductor layer having a top side, comprising the steps of:

growing an insulating layer on the top side of the semiconductor layer;

depositing a first conductive layer on the insulating layer, the first conductive layer having a top side;

forming a plurality of trench isolation regions along a first direction, a trench isolation region extending downwardly into the semiconductor layer;

depositing a layer of a sacrificial material on the top side of the first conductive layer, the layer of the sacrificial material having a top side;

etching the layer of the sacrificial material to form a plurality of isolation channels along a second direction, two adjacent isolation channels delimiting a block of the sacrificial material, the block of the sacrificial material having two lateral sides, a top, and a bottom;

forming two gate masks along two lateral sides of the block of the sacrificial material, one gate mask on each lateral side;

etching the first conductive layer to extend the plurality of isolation channels to the insulating layer, two adjacent isolation channels delimiting a block of the first conductive layer, the block of the first conductive layer being located under the block of the sacrificial material;

etching the block of the sacrificial material to form a control channel;

etching the block of the first conductive layer to form two lateral blocks of the first conductive layer under two gate masks, the two lateral blocks include a first lateral block and a second lateral block; and filling the control channel with a second conductive layer.

2. The method of claim 1, further comprising the step of extending the isolation channel to the semiconductor layer.

3. The method of claim 1, further comprising the step of etching anisotropically the second conductive layer to form a first block and a second block of the second conductive layer, the first block of the second conductive layer facing the first block of the first conductive layer and the second block of the second conductive layer facing the second block of the first conductive layer.

4. The method of claim 3, further comprising the step of forming a diffusion region on the semiconductor layer and between two blocks of the second conductive layer.

5. The method of claim 1, further comprising the step of depositing an oxide layer to cover the entire memory device.

6. The method of claim 1, wherein the second conductive layer having a width defined by two adjacent isolation channels.

7. The method of claim 1, wherein the insulating layer is tunnel oxide.

8. The method of claim 1, wherein the first conductive layer is a first polysilicon and the second conductive layer is a second polysilicon.

9. The method of claim 1, wherein the sacrificial material is silicon nitride.

10. The method of claim 1, wherein the step of forming a plurality of trench isolation regions along a first direction further comprises the steps of:

etching a trench channel extending from the top of the first conductive layer into a second semiconductor layer; and filling the trench channel with an oxide.

11. The method of claim 10, wherein the step of filling the trench channel is done through a high density plasma oxide deposition.

12. The method of claim 10, wherein the step of filling the trench channel is done through a chemical vapor deposition.

13. The method of claim 10, wherein the step of filling the trench channel is done through a silicon glass deposition process.

14. The method of claim 10, wherein the step of filling the trench channel is done through a spin-on-glass deposition process.

15. The method of claim 10, further comprising the step of polishing the oxide in the trench channel through a chemical mechanical polishing process.

16. The method of claim 1, wherein the step of forming a plurality of trench isolation regions along a first direction further comprises the steps of:

etching a trench channel extending from the top of the first conductive layer into the semiconductor layer; and filling the trench channel with an oxide.

17. The method of claim 1, further comprising the step of growing a liner oxide over the trench isolation regions.

18. The method of claim 1, wherein the trench isolation region having a bottom, and further comprising the step of performing field implants on the bottom of the trench isolation region.

19. The method of claim 1, further comprising the step of growing a layer of oxide spacer on the top of the isolation channels.

20. The method of claim 19, further comprising the step of etching anisotropically the layer of oxide spacer.

21. The method of claim 1, further comprising/the step of forming a diffusion region at the bottom of an isolation channel by doping the bottom of the isolation channel with a first dopant.

22. The method of claim 21, further comprising the step of growing a layer of liner oxide.

23. The method of claim 1, further comprising the steps of:

etching the insulating layer to extend the control channel to a second semiconductors layer; and performing a high voltage threshold implant on the bottom of the control channel.

24. The method of claim 1, further comprising the step of growing a gate oxide on the bottom of the control channel.

* * * * *